(12) United States Patent
Chen et al.

(10) Patent No.: US 10,811,390 B2
(45) Date of Patent: Oct. 20, 2020

(54) DIE STACK STRUCTURE AND METHOD OF FABRICATING THE SAME AND PACKAGE

(71) Applicant: Taiwan Semiconductor Manufacturing Co., Ltd., Hsinchu (TW)

(72) Inventors: Jie Chen, New Taipei (TW); Hsien-Wei Chen, Hsinchu (TW); Ming-Fa Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/252,727

(22) Filed: Jan. 21, 2019

(65) Prior Publication Data

US 2020/0235073 A1     Jul. 23, 2020

(51) Int. Cl.
| | |
|---|---|
| H01L 25/065 | (2006.01) |
| H01L 23/00 | (2006.01) |
| H01L 25/00 | (2006.01) |
| H01L 21/66 | (2006.01) |
| H01L 21/768 | (2006.01) |
| H01L 21/48 | (2006.01) |
| H01L 21/56 | (2006.01) |
| H01L 23/31 | (2006.01) |
| H01L 23/498 | (2006.01) |

(52) U.S. Cl.
CPC ...... *H01L 25/0657* (2013.01); *H01L 21/4857* (2013.01); *H01L 21/56* (2013.01); *H01L 21/76877* (2013.01); *H01L 22/14* (2013.01); *H01L 22/32* (2013.01); *H01L 23/3107* (2013.01); *H01L 23/49822* (2013.01); *H01L 24/03* (2013.01); *H01L 24/08* (2013.01); *H01L 24/27* (2013.01); *H01L 24/32* (2013.01); *H01L 25/50* (2013.01); *H01L 2224/08146* (2013.01); *H01L 2224/32145* (2013.01)

(58) Field of Classification Search
CPC ..... H01L 25/0657; H01L 22/14; H01L 22/32; H01L 21/4857; H01L 21/56; H01L 23/49822
See application file for complete search history.

(56) References Cited

U.S. PATENT DOCUMENTS

| | | | |
|---|---|---|---|
| 7,863,092 B1 * | 1/2011 | Chaware | H01L 21/76898 438/106 |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2011/0065215 A1 * | 3/2011 | Viswanadam | H01L 21/76898 438/15 |

* cited by examiner

*Primary Examiner* — Tucker J Wright
(74) *Attorney, Agent, or Firm* — JCIPRNET

(57) ABSTRACT

Provided is a die stack structure including a first die and a second die. The first die and the second die are bonded together through a hybrid bonding structure. A bonding insulating layer of the hybrid bonding structure extends to contact with one interconnect structure of the first die or the second die.

20 Claims, 15 Drawing Sheets

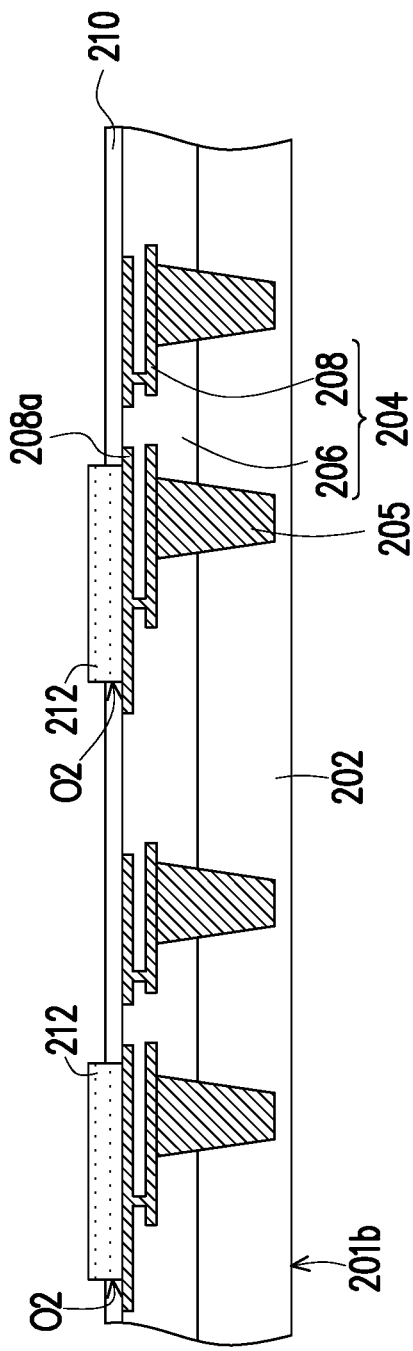
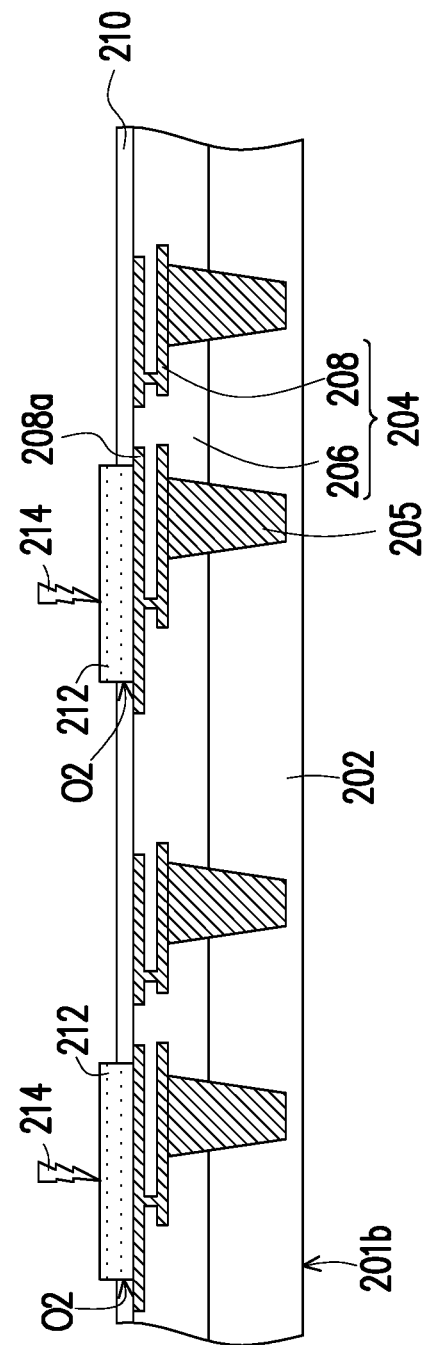
FIG. 1E
FIG. 1F

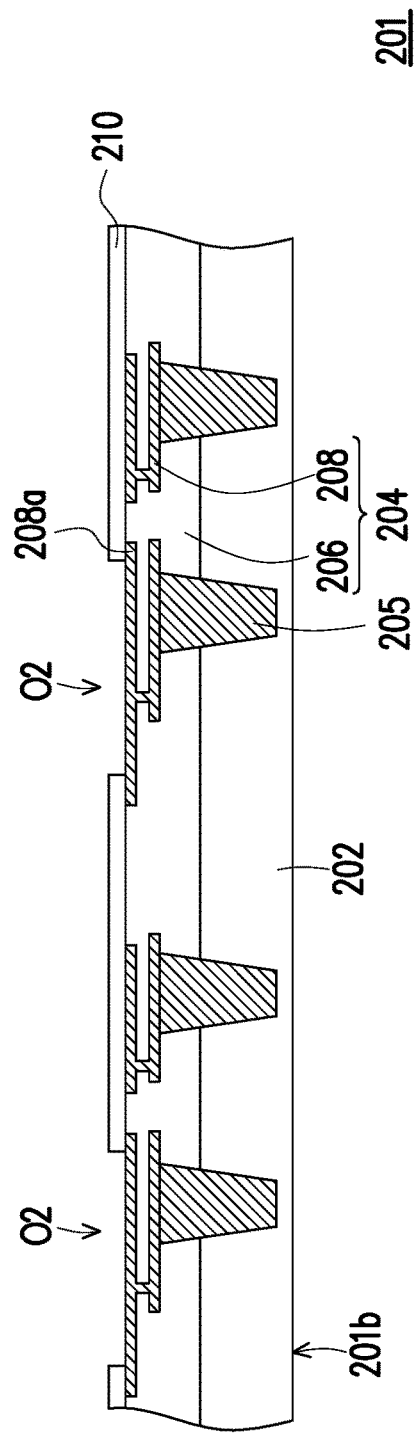
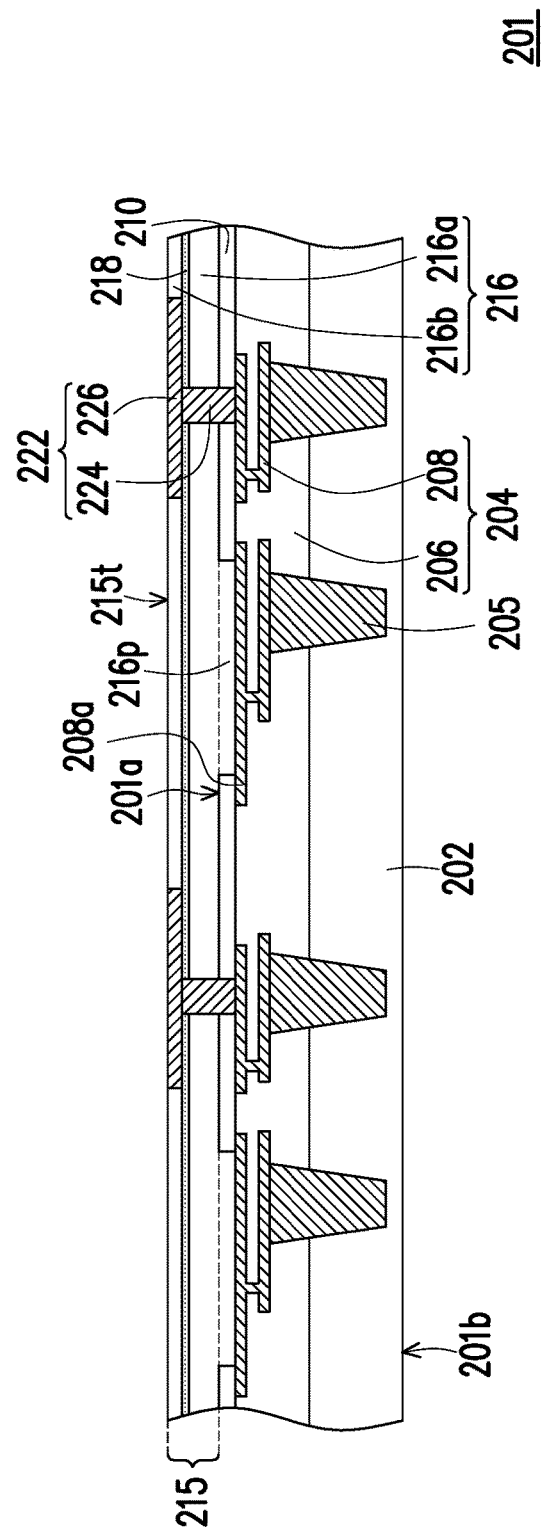

DIE STACK STRUCTURE AND METHOD OF FABRICATING THE SAME AND PACKAGE

BACKGROUND

In recent years, the semiconductor industry has experienced rapid growth due to continuous improvement in integration density of various electronic components, e.g., transistors, diodes, resistors, capacitors, etc. Such improvement in integration density is mostly attributed to successive reductions in minimum feature sizes, which allows more components to be integrated into a given area.

These smaller electronic components also require smaller packages that occupy less area than previous packages. Some types of packages for semiconductors include quad flat pack (QFP), pin grid array (PGA), ball grid array (BGA), flip chips (FC), three dimensional integrated circuits (3DICs), wafer level packages (WLPs), and package on package (PoP) devices. Some 3DICs are prepared by placing chips over chips on a semiconductor wafer level. 3DICs provide improved integration density and other advantages, such as faster speeds and higher bandwidth, because of the decreased length of interconnects between the stacked chips. However, there are quite a few challenges to be handled for the technology of 3DICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 1K are cross-sectional views of a method of forming a die stack structure in accordance with a first embodiment.

DETAILED DESCRIPTION

Figure 1A:
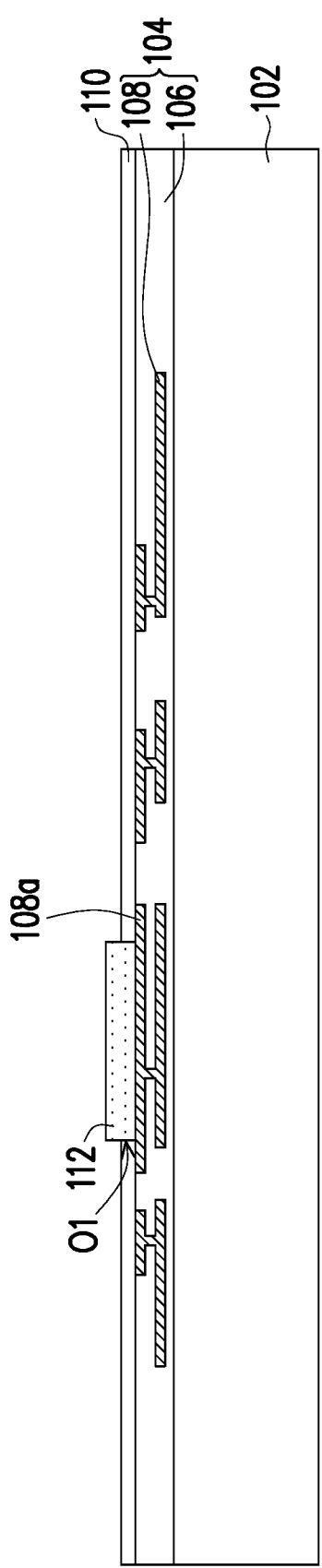

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1K are cross-sectional views of a method of forming a die stack structure in accordance with a first embodiment.

Referring to FIG. 1A, a first die 100 is provided. The first die 100 may be an application-specific integrated circuit (ASIC) chip, an analog chip, a sensor chip, a wireless and radio frequency chip, a voltage regulator chip or a memory chips, for example. In alternative embodiments, the first die 100 may be a wafer having a plurality of dies with a same function or different functions. In detail, the first die 100 includes a first semiconductor substrate 102, a first interconnect structure 104, a first passivation layer 110, and a first test pad 112.

In some embodiments, the semiconductor substrate 102 may include silicon or other semiconductor materials, such as a silicon or semiconductor wafer. Alternatively, or additionally, the first semiconductor substrate 102 may include other elementary semiconductor materials such as germanium. In some embodiments, the first semiconductor substrate 102 is made of a compound semiconductor such as silicon carbide, gallium arsenic, indium arsenide or indium phosphide. In some embodiments, the first semiconductor substrate 102 is made of an alloy semiconductor such as silicon germanium, silicon germanium carbide, gallium arsenic phosphide, or gallium indium phosphide. In some embodiments, the first semiconductor substrate 102 includes an epitaxial layer. For example, the first semiconductor substrate 102 has an epitaxial layer overlying a bulk semiconductor substrate. In other embodiments, the semiconductor substrate 102 may be an interposer.

Referring to FIG. 1A, the first interconnect structure 104 is formed over the first semiconductor substrate 102. In detail, the first interconnect structure 104 includes a first insulating material 106 and a plurality of first metal features 108. The first metal features 108 are formed in the first insulating material 106 and electrically connected to each other. In some embodiments, the first insulating material 106 includes an interlayer dielectric (ILD) layer on the first semiconductor substrate 102, and at least one inter-metal dielectric (IMD) layer over the inner-layer dielectric layer. In some embodiments, the first insulating material 106 includes silicon oxide, silicon oxynitride, silicon nitride, low dielectric constant (low-k) materials or a combination thereof. In some alternatively embodiments, the first insulating material 106 may be a single layer or multiple layers. In some embodiments, the first metal features 108 include plugs and metal lines. The plugs may include contacts formed in the ILD layer, and vias formed in the IMD layer. The contacts are formed between and in contact with the substrate 102 and a bottom metal line. The vias are formed between and in contact with two metal lines. The first metal features 108 may be made of tungsten (W), copper (Cu), copper alloys, aluminum (Al), aluminum alloys, or a combination thereof. In some alternatively embodiments, a barrier layer (not shown) may be formed between the first metal features 108 and the first insulating material 106 to prevent the material of the first metal features 108 from migration. A material of the barrier layer includes tantalum, tantalum nitride, titanium, titanium nitride, cobalt-tungsten (CoW) or a combination thereof, for example.

In addition, the first device region (not shown) is formed between the first semiconductor substrate 102 and the first interconnect structure 104 by a front-end-of-line (FEOL) process. The first device region includes a wide variety of devices. In some embodiments, the devices comprise active components, passive components, or a combination thereof. In some embodiments, the devices may include integrated circuits devices. The devices are, for example, transistors, capacitors, resistors, diodes, photodiodes, fuse devices, or other similar devices. In some embodiments, the first device region includes a gate structure, source/drain regions, and isolation structures, such as shallow trench isolation (STI) structures. The said first device region is merely an example, while other structures may be formed in the first device region. In the first device region, various N-type metal-oxide semiconductor (NMOS) and/or P-type metal-oxide semiconductor (PMOS) devices, such as transistors or memories and the like, may be formed and interconnected to perform one or more functions. Other devices, such as capacitors, resistors, diodes, photodiodes, fuses and the like may also be formed on the first semiconductor substrate 102. The functions of the devices may include memory, processors, sensors, amplifiers, power distribution, input/output circuitry, or the like.

Referring to FIG. 1A, the first passivation layer 110 is formed over the first interconnect structure 104. The first passivation layer 110 is patterned to form a first opening O1. In the case, a portion of the first metal features 108, such as a top metal feature 108a, is exposed by the first opening O1 of the first passivation layer 110, so that the top metal feature 108a may be electrically connected to the first test pad 112. In some embodiments, the first passivation layer 110 includes silicon oxide, silicon nitride, benzocyclobutene (BCB) polymer, polyimide (PI), polybenzoxazole (PBO) or a combination thereof and is formed by a suitable process such as spin coating, CVD or the like.

Referring to FIG. 1A, the first test pad 112 is formed in the first opening O1 to contact with the top metal feature 108a of the first interconnect structure 104. A material of the first test pad 112 is different from the material of the first metal features 108. In some embodiments, the material of the first test pad 112 is softer than the material of the first metal features 108. In some embodiments, the first test pad 112 includes a solder layer having Sn or Sn alloy. The first test pad 112 may be formed by a printing process, a plating process, or the like. In some alternative embodiments, in order to remove the first test pad 112 without damage the underlying first metal features 108 in the following process, a Al pad, a Cu pad a AlCu pad, or the like would not be selected as the first test pad 112.

Figure 1B:
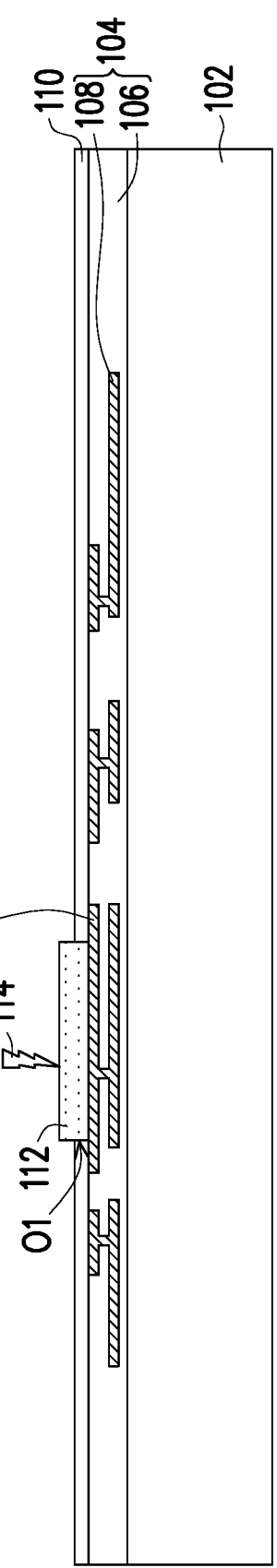

Referring to FIG. 1B, a first circuit probing (CP) test is performed on the first test pad 112. Specifically, a probe 114 may be used to electrically couple to the first test pad 112 for wafer or die testing to check whether the die is a good die. In some embodiments, the CP test is also referred to as wafer acceptance testing (WAT). In some embodiments, the first test pad 112 is used for electrical testing to check whether the first die 100 is a good die, but the disclosure is not limited thereto. The first die 100 may be selected to test different properties of the wafer or the die, such as leakage current, breakdown voltage, threshold voltage and effective channel length, saturation current, contact resistance and connections. It should be noted that the first die 100 is selected to proceed the following process when the first die 100 is identified as a known good die (KGD).

Figure 1C:
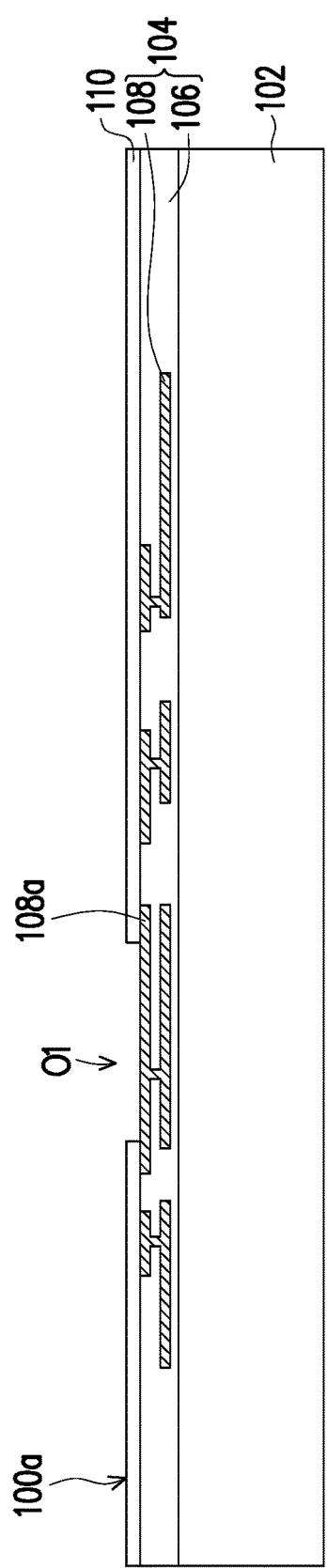

Referring to FIG. 1B and FIG. 1C, after the first CP test is done, the first test pad 112 is removed by a removal process. In some embodiments, the removal process includes a wet etching process using $H_2SO_4$ based etchant, $HNO_3$ based etchant, a combination thereof or the like. In some embodiments, the etchant may include Nitric Acid, Ferric nitrate solution, and Methanesulfonic acid, for example. In some alternative embodiments, the wet etching process is performed at a high etching selectivity ratio of the first test pad 112 to the first metal features 108 and the first passivation layer 110. That is, the first test pad 112 is completely removed, while only few portions of first metal features 108 and the first passivation layer 110 are consumed during the wet etching process. Therefore, the top metal feature 108a exposed by the first opening O1 is not ease to be damaged during the wet etching process compared with a dry etching process. In FIG. 1C, the top metal feature 108a is exposed by the first opening O1 after the first test pad 112 is removed.

Figure 1D:
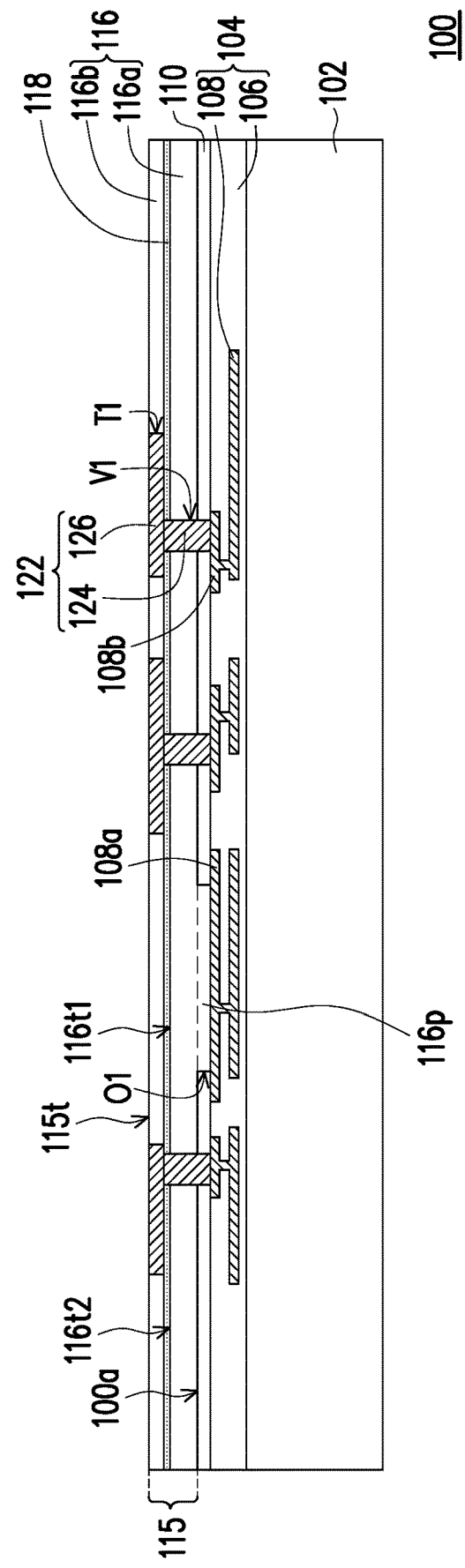

Referring to FIG. 1D, a first bonding structure 115 is formed over a front side 100a of the first die 100. Herein, the front side 100a of the first die 100 is referred to as a top surface of the first passivation layer 110. In detail, as shown in FIG. 1D, after the first die 100 is identified as the known good die, a bonding dielectric material 116a (or referred to as a first bonding dielectric material) is formed over the front side 100a of the first die 100 to fill in the first opening O1 and contact with the top metal feature 108a of the first interconnect structure 104. Specifically, the bonding dielectric material 116a covers the first passivation layer 110 and extends into the first opening O1. From another perspective, the bonding dielectric material 116a has a first protrusion 116p extending from the front side 100a of the first die 100 to contact with the top metal feature 108a of the first interconnect structure 104. In some embodiments, the bonding dielectric material 116a includes silicon oxide, silicon nitride, polymer or a combination thereof. The bonding dielectric material 116a is formed by depositing a dielectric material through a suitable process such as spin coating, CVD or the like, and then performing a planarization process on the dielectric material. In some embodiments, the planarization process includes a CMP process, an etching back process, or a combination thereof.

It should be noted that, in some embodiment, the topology of the bonding dielectric material 116a overlying the first opening O1 becomes flat after the first test pad 112 is removed. That is, as shown in FIG. 1D, a top surface 116t0 of the bonding dielectric material 116a overlying the first opening O1 and a top surface 116t2 of the bonding dielectric material 116a out of the first opening O1 are substantially coplanar after performing the planarization process on the dielectric material. In the case, a bondable topography variation (BTV) of a top surface 115t of the first bonding structure 115 is small enough to ease to directly bond to other dies or chips. Here, the bondable topography variation (BTV) is referred as a height difference between a highest point and a lowest point of the top surface 115*t* of the first bonding structure 115.

Referring to FIG. 1D, a first blocking layer 118 is blankly formed to cover the bonding dielectric material 116*a*. In some embodiments, the first blocking layer 118 includes a dielectric material, such as silicon oxide, silicon nitride, silicon oxynitride, or a combination thereof, and is formed by a suitable process such as CVD, ALD, or the like. In some embodiments, a thickness of the first blocking layer 118 is 0.05 μm to 0.3 μm.

Referring to FIG. 1D, another bonding dielectric material 116*b* (or referred to as a second bonding dielectric material) is formed over the first blocking layer 118. That is, the first blocking layer 118 is disposed between the bonding dielectric materials 116*a* and 116*b*. A material of the first blocking layer 118 is different from that of the bonding dielectric material 116*a* and 116*b*. For example, the first blocking layer 118 may be a SiN layer, while the bonding dielectric material 116*a* and 116*b* may be SiO layers. The bonding dielectric materials 116*a* and 116*b* may be referred to as a first bonding dielectric layer 116. The material and forming method of the bonding dielectric material 116*b* are similar to the material and forming method of the bonding dielectric material 116*a*. Thus, details thereof are omitted here.

Referring to FIG. 1D, a first bonding metal layer 122 is formed in the bonding dielectric material 116*a* and 116*b*, the first blocking layer 118, and the first passivation layer 110. In some embodiments, the first bonding metal layer 122 includes a via plug 124 and a conductive feature 126. In some other embodiments, the conductive feature 126 is a via plug having a larger area than the via plug 124.

The via plug 124 penetrates through the first blocking layer 118, the bonding dielectric material 116*a* and the first passivation layer 110, and is in contact with the first metal features 108. The conductive feature 126 is disposed over the first blocking layer 118 and connected to the via plug 124. In other words, the conductive feature 126 is electrically connected to the first metal features 108 through the via plug 124. In some embodiments, the first bonding metal layer 122 may include copper, copper alloys, nickel, aluminum, tungsten, a combination of thereof. In alternative embodiments, some dummy metal layers (not shown) may be included over the first blocking layer 118 by a single damascene process. Herein, when elements are described as "dummy", the elements are electrically floating or electrically isolated from other elements. For example, some dummy metal layers are electrically floating and embedded in the bonding dielectric material 116*b* for improving the following planarization process.

In some embodiment, the first bonding metal layer 122 is formed by a dual damascene process. In detail, the first bonding metal layer 122 are formed by a trench first process, a via hole first process, a trench first process or a self-aligned process.

In some embodiments, the first bonding metal layer 122 is formed as following steps (referred to as the trench first process). The dielectric layer 116*b* is patterned by lithography and etching processes to form trenches T1 therein. The trenches T1 are corresponding to the top metal features 108*b* underlying the first passivation layer 110. During the etching process, the first blocking layer 118 serves as an etching stop layer, and thus the first blocking layer 118 is exposed by the trenches T1. Next, a portion of the first blocking layer 118 exposed by the trenches T1 and the underlying bonding dielectric material 116*a* and the first passivation layer 110 are patterned by lithography and etching processes to form via holes V1 therein. The via holes V1 expose the top metal features 108*b*. Thereafter, a conductive material layer is formed on the dielectric layer 116*b*, and fills into the trenches T1 and the via holes V1. The conductive material layer on the bonding dielectric material 116*b* is then removed by a planarization process, such as a CMP process, and thus the via plugs 124 and the conductive features 126 are formed in the via holes V1 and the trenches T1 respectively.

In some other embodiments, the first bonding metal layer 122 is formed as following steps (referred to as a via hole first process). The bonding dielectric materials 116*a* and 116*b*, the first blocking layer 118 and the first passivation layer 110 are patterned by lithography and etching processes to form via holes V1. Next, the bonding dielectric material 116*b* is patterned by lithography and etching processes to form trenches T1 therein. During the etching process, the first blocking layer 118 is serves as an etching stop layer, and thus the first blocking layer 118 is exposed by the trenches T1. Thereafter, the conductive material layer is formed and the planarization process is performed.

In alternative embodiments, the first bonding metal layer 122 are formed as following steps (referred to as the self-aligned process). After the bonding dielectric material 116*a* is formed, the first blocking layer 118 is formed and patterned by lithography and etching processes to form via hole patterns therein. Next, the bonding dielectric material 116*b* is formed over the first blocking layer 118 with the via hole patterns. The bonding dielectric material 116*b* fills into the via hole patterns of the first blocking layer 118 and is in contact with the bonding dielectric material 116*a*. Thereafter, a patterned mask with trench patterns is formed on the bonding dielectric material 116*b* by a lithography process, some of the trench patterns are corresponding to the via hole patterns of the first blocking layer 118. Thereafter, an etching process is performed on the bonding dielectric material 116*b* by using the first blocking layer 118 as an etching stop layer, so that the trenches T1 are formed. At the same time, the bonding dielectric material 116*a* is etched by using the first blocking layer 118 with the via hole patterns as a hard mask, so that via holes V1 are formed in the bonding dielectric material 116*a* and self-aligned with the trenches T1. Thereafter, the conductive material layer is formed and the planarization process is performed.

Figure 1I:
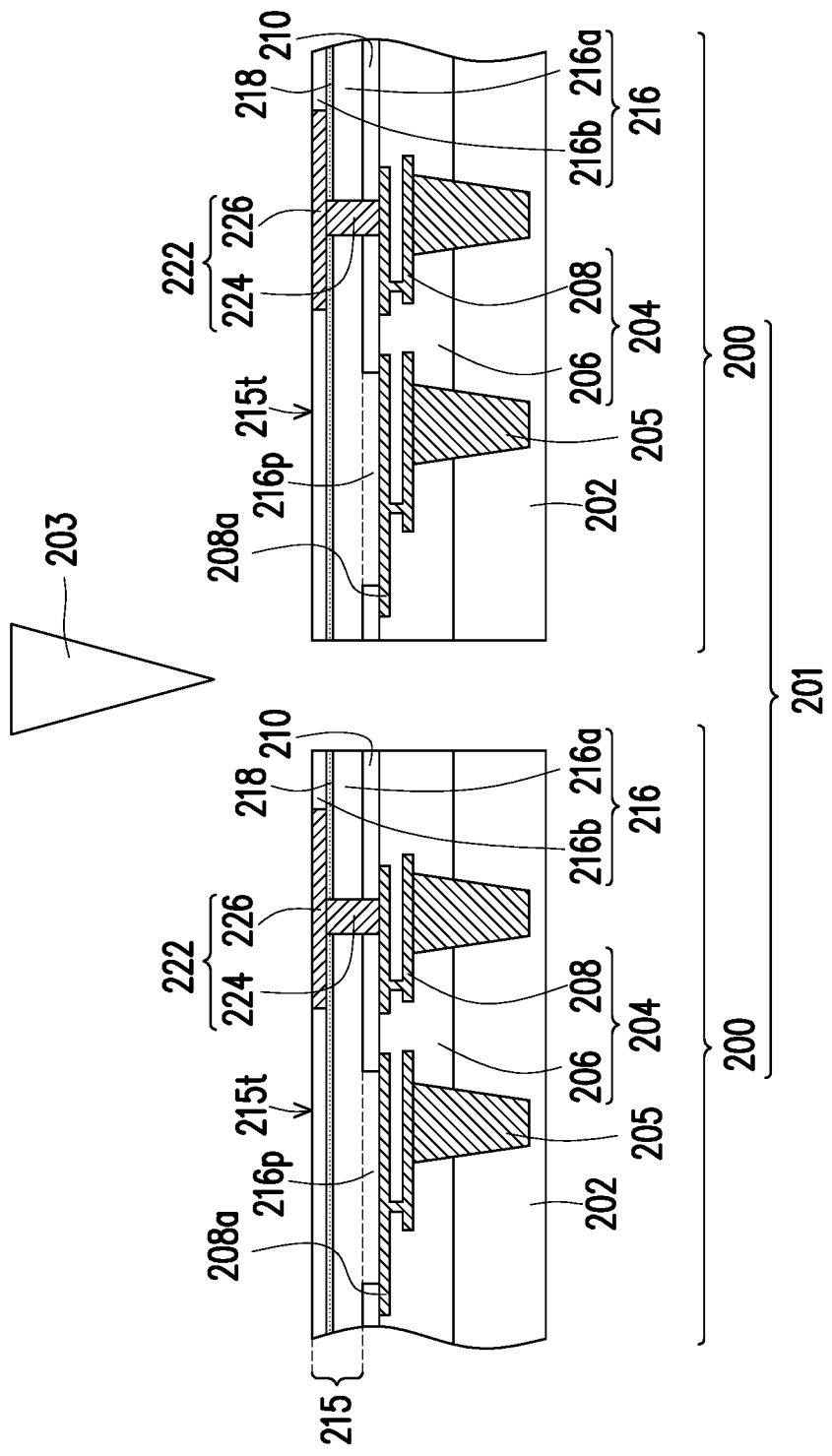

Referring to FIG. 1E, a wafer 201 having a plurality of second dies 200 (as shown in FIG. 1I) is provided. The wafer 201 may be an application-specific integrated circuit (ASIC) chip, an analog chip, a sensor chip, a wireless and radio frequency chip, a voltage regulator chip or a memory chips, for example. The wafer 201 and the first die 100 may be the same types of dies or different types of dies. In some embodiments, the wafer 201 may be an active component or a passive component.

In some embodiments, the wafer 201 is similar to the second die 100. That is, the wafer 201 includes a second semiconductor substrate 202, a second interconnect structure 204, a second passivation layer 210, and a second test pad 212. The arrangement, material and forming method of the wafer 201 are similar to the arrangement, material and forming method of the first die 100. Thus, details thereof are omitted here. As shown in FIG. 1E, the wafer 201 further includes a plurality of through-substrate vias (TSVs) 205 embedded in the second semiconductor substrate 202 and a second insulating material 206 to electrically connect to second metal features 208 of the second interconnect structure 204. In the case, the TSVs 205 is covered by a backside 201*b* of the wafer 201.

Referring to FIG. 1F, a second circuit probing (CP) test is performed on the second test pad 212. Specifically, a probe 214 may be used to electrically couple to the second test pad 212 for wafer or die testing to check whether the die is a good die.

Referring to FIGS. 1F and 1G, after the second CP test is done, the second test pad 212 is removed by a removal process. In some embodiments, the removal process includes a wet etching process using $H_2SO_4$ based etchant, $HNO_3$ based etchant, a combination thereof or the like. In some embodiments, the etchant may include Nitric Acid, Ferric nitrate solution, and Methanesulfonic acid, for example. In the case, as shown in FIG. 1G, a top metal feature 208a is exposed by the second opening O2 after the second test pad 212 is removed.

Referring to FIG. 1H, a second bonding structure 215 is formed over a front side 201a of the wafer 201. Herein, the front side 201a of the wafer 201 is referred to as a top surface of the second passivation layer 210. In detail, as shown in FIG. 1H, after the wafer 201 is identified as the known good die, a bonding dielectric material 216a (or referred to as a third bonding dielectric material) is formed over the front side 201a of the wafer 201 to fill in the second opening O2 and contact with the top metal feature 208a of the second interconnect structure 204. Specifically, the bonding dielectric material 216a covers the second passivation layer 210 and extends into the second opening O2. From another perspective, the bonding dielectric material 216a has a second protrusion 216p extending from the front side 201a of the wafer 201 to contact with the top metal feature 208a of the second interconnect structure 204. In some embodiment, the topology of the bonding dielectric material 216a overlying the second opening O2 becomes flat after the second test pad 212 is removed. Therefore, a bondable topography variation (BTV) of a top surface 215t of the second bonding structure 215 is small enough to ease to directly bond to other dies or chips.

In FIG. 1H, a second blocking layer 218 is then blankly formed to cover the bonding dielectric material 216a. Another bonding dielectric material 216b (or referred to as a fourth bonding dielectric material) is formed over the second blocking layer 218. That is, the second blocking layer 218 is disposed between the bonding dielectric materials 216a and 216b. A material of the second blocking layer 218 is different from that of the bonding dielectric material 216a and 216b. For example, the second blocking layer 218 may be a SiN layer, while the bonding dielectric material 216a and 216b may be SiO layers. The bonding dielectric materials 216a and 216b may be referred to as a second bonding dielectric layer 216. A second bonding metal layer 222 including a via plug 224 and a conductive feature 226 disposed over the via plug 224 is then formed in the second bonding dielectric layer 216 by the dual damascene process. The material and forming method of the bonding dielectric materials 116a, 116b, the second blocking layer 218, and the second bonding metal layer 222 are similar to the material and forming method of the bonding dielectric material 116a, 116b, the first blocking layer 118, and the first bonding metal layer 122. Thus, details thereof are omitted here.

Referring to FIG. 1I, after the second bonding structure 215 is formed, a singulation process 203 is performed on the wafer 201 to form individual and separate second dies 200. In some embodiments, the singulation process 203 is a wafer dicing process including mechanical sawing, laser cutting, or a combination thereof. In alternative embodiments, the second dies 200 may have the same or different functions.

Figure 1J:
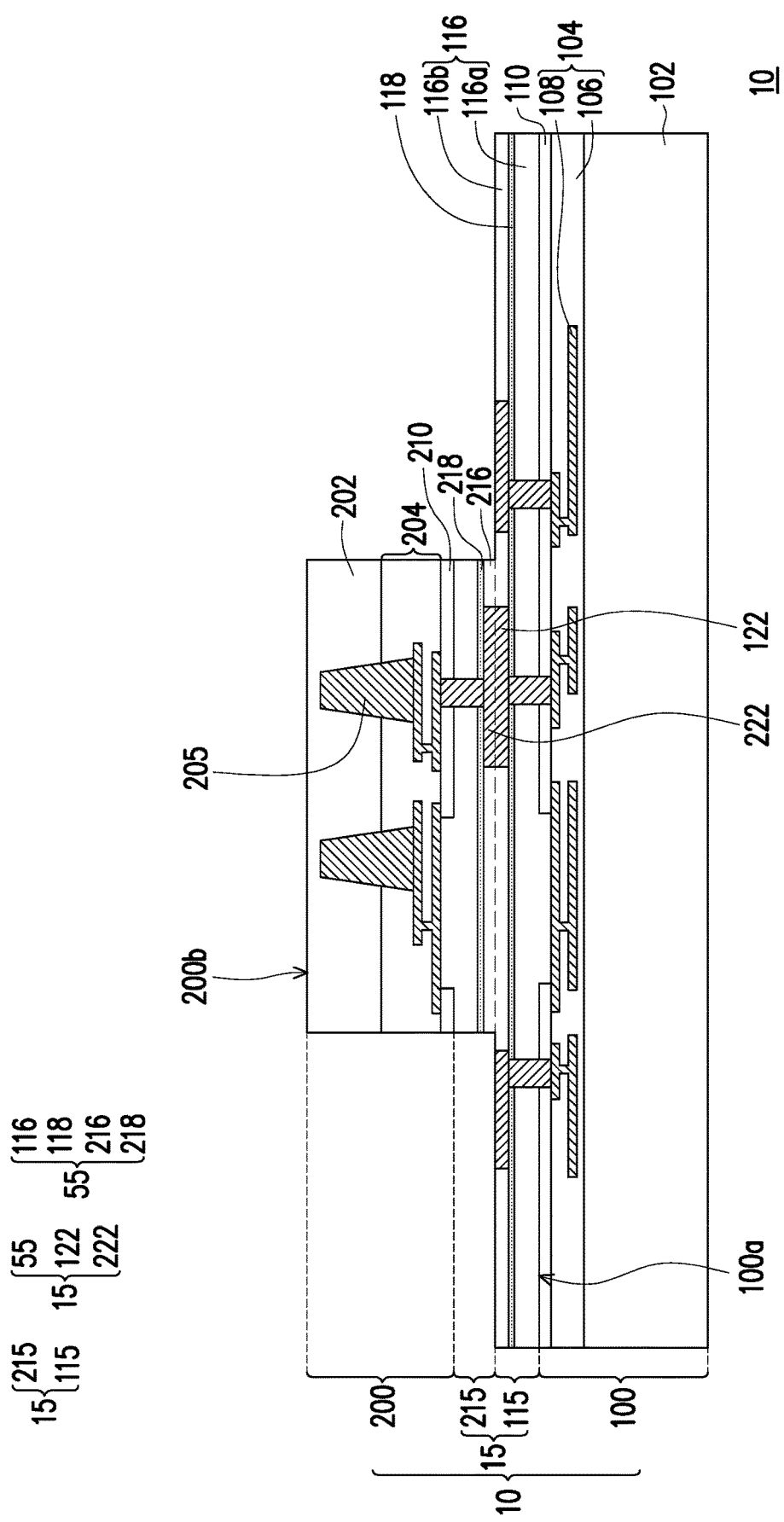

Referring to FIG. 1J, after the singulation process 203 is performed and the second die 200 is identified as a known good die (KGD), the second die 200 is further turned upside down and mounted onto the first die 100. In detail, the first die 100 and the second die 200 are face-to-face bonded together via the first bonding structure 115 and the second bonding structure 215. In some embodiments, before the second die 200 is bonded to the first die 100, the first bonding structure 115 and the second bonding structure 215 are aligned, such that the first bonding metal layer 122 may be bonded to the second bonding metal layer 222 and the first bonding dielectric layer 116 may be bonded to the second bonding dielectric layer 216. In some embodiments, the alignment of the first bonding structure 115 and the second bonding structure 215 may be achieved by using an optical sensing method. After the alignment is achieved, the first bonding structure 115 and the second bonding structure 215 are bonded together by a hybrid bonding to form a hybrid bonding structure 15. The hybrid bonding structure 15 includes the first bonding metal layer 122, the second bonding metal layer 222, and a bonding insulating layer 55. The bonding insulating layer 55 includes the first bonding dielectric layer 116, the first blocking layer 118, the second bonding dielectric layer 216, and the second blocking layer 218.

The first bonding structure 115 and the second bonding structure 215 are hybrid bonded together by the application of pressure and heat. It is noted that the hybrid bonding involves at least two types of bonding, including metal-to-metal bonding and non-metal-to-non-metal bonding such as dielectric-to-dielectric bonding or fusion bonding. As shown in FIG. 1J, the hybrid bonding structure 15 includes the first bonding metal layer 122 and the second bonding metal layer 222 bonded by metal-to-metal bonding, and the first bonding dielectric layer 116 and the second bonding dielectric layer 216 bonded by non-metal-to-non-metal bonding.

Figure 1K:
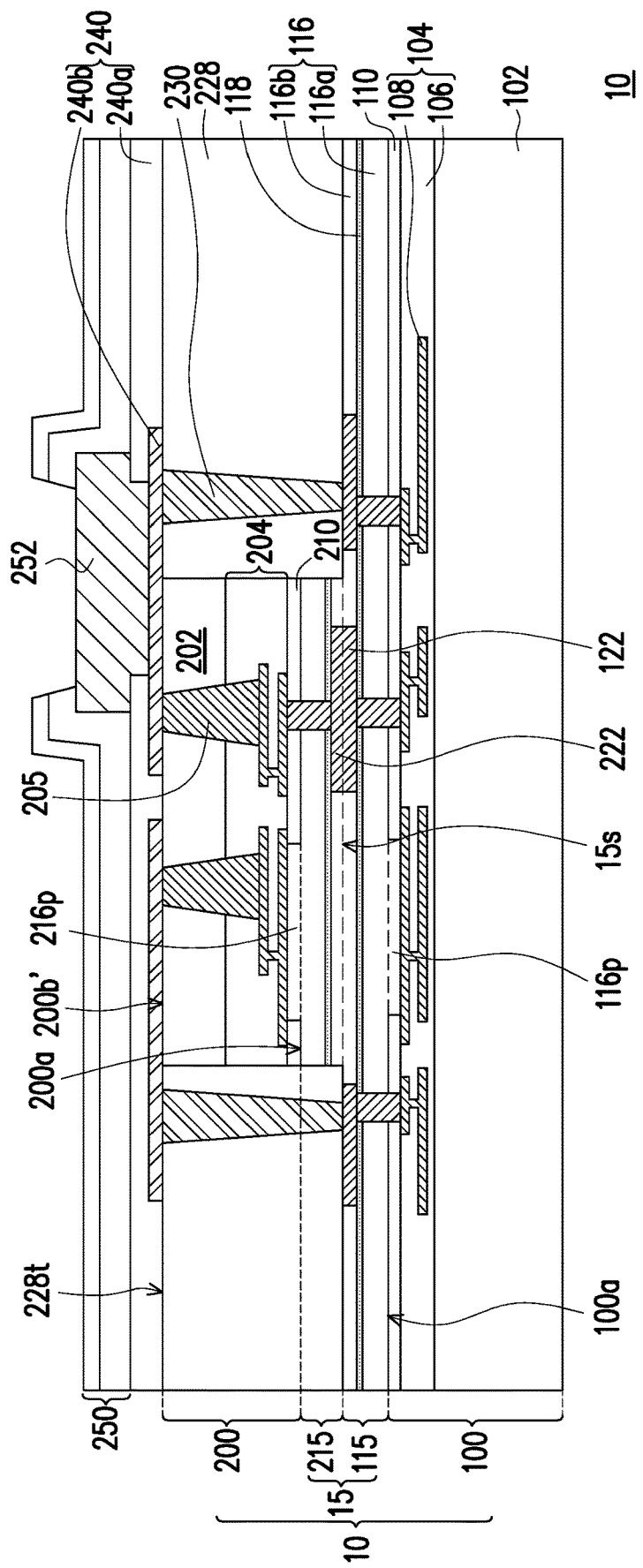

Referring to FIGS. 1J and 1K, a gap-filling layer 228 is formed aside and laterally encapsulates the second die 200. More specifically, the gap-filling layer 228 is formed around the second die 200 and covers the front side 100a of the first die 100. The gap-filling layer 228 may be formed by firstly forming a gap-filling material (not shown) over and covering the second die 200. Thereafter, the gap-filling material over the second die 200 is removed by a planarization process, such as a CMP process. In some embodiments, portions of the gap-filling material and the second semiconductor substrate 202 are removed, so that a backside 200b of the second die 200 (as shown in FIG. 1J) lowers until the TSVs 205 is exposed by a backside 200b' of the second die 200 (as shown in FIG. 1K). In the case, the backside 200b' of the second die 200 is substantially planar with a top surface 228t of the gap-filling layer 228.

In some embodiments, the gap-filling layer 228 includes an inorganic dielectric, which may be an oxide-based dielectric, such as silicon oxide. For example, the silicon oxide may be formed of tetraethoxysilane (TEOS). The forming method may include Chemical Vapor Deposition (CVD), High-Density Plasma Chemical Vapor Deposition (HDP-CVD), or the like. In some alternative embodiments, the gap-filling layer 228 includes a molding compound, a molding underfill, a resin such as epoxy, a combination thereof, or the like. The forming method of the gap-filling layer 228 includes a molding process, a molding underfilling (MUF) process, or a combination thereof.

Referring to FIG. 1K, at least one through dielectric via (TDV) 230 is formed in the gap-filling layer 228 to electrically connect to the first interconnect structure 104 and the to-be-formed redistribution circuit structure 240. In some embodiments, the TDV 230 includes a conductive via. The conductive via is made of copper, copper alloys, aluminum, aluminum alloys, or combinations thereof. In some other embodiments, the TDV 230 further includes a diffusion barrier layer (not shown) surround the conductive via. The diffusion barrier layer is made of Ta, TaN, Ti, TiN, CoW or a combination thereof, and may be formed by a suitable process such as electro-chemical plating process, CVD, atomic layer deposition (ALD), PVD or the like.

Referring to FIG. 1K, after the TDV 230 is formed, a redistribution circuit structure 240 is formed over the back side 200b' of the second die 200 and over the top surface 228t of the gap-filling layer 228. The redistribution circuit structure 240 includes a plurality of dielectric layers 240a and a plurality of redistribution conductive layers 240b stacked alternately. One portion of the redistribution conductive layers 240b is electrically connected to the TSVs 205. Another portion of the redistribution conductive layers 240b is electrically connected to the TDV 230. The TDV 230 and one of the TSVs 205 are electrically connected by the other portion of the redistribution conductive layers 240b. Furthermore, at least one bonding pad 252 penetrates through the dielectric layer 240a to contact with the redistribution conductive layers 240b. The bonding pad 252 may be used for mounting conductive connectors (e.g., metal pillars, µ-bumps or a combination thereof) bumps, and/or for conducting a die backside performance test. The number of the bonding pad 252 is not limited in this disclosure. The material of the bonding pad 252 includes a metal, such as aluminum, copper, nickel, gold, silver, tungsten or alloys thereof.

Referring to FIG. 1K, after a passivation layer 250 is formed over the redistribution circuit structure 240 and partially covers the bonding pad 252, a die stack structure 10 is accomplished. In the case, the die stack structure 10 may be a chip-on-wafer (CoW) structure. In some embodiments, the passivation layer 250 includes silicon oxide, silicon nitride, benzocyclobutene (BCB) polymer, polyimide (PI), polybenzoxazole (PBO) or a combination thereof and is formed by a suitable process such as spin coating, CVD or the like.

In FIG. 1K, the die stack structure 10 includes the first die 100 and the second die 200 which are face-to-face bonded together by the hybrid bonding structure 15. The first bonding dielectric layer 116 has the first protrusion 116p extending from the front side 100a of the first die 100 to contact with a first interconnect structure 104 of the first die 100. In addition, the second bonding dielectric layer 216 has the second protrusion 216p extending from the front side 200a of the second die 200 to contact with the second interconnect structure 204 of the second die 200. The second protrusion 216p corresponds to and is disposed directly over the first protrusion 116p. That is, a region between the first protrusion 116p and the second protrusion 216p is metal-free or without any test pad. In the case, a bonding interface 15s between the first bonding structure 115 and the second bonding structure 215 is substantially flat, so that the first bonding structure 115 and the second bonding structure 215 have a better bonding property, thereby increasing a reliability of the die stack structure 10. In some alternative embodiments, the second protrusion 216p may be not disposed directly over the first protrusion 116p. In other words, the second protrusion 216p may partially overlap or not overlap with the first protrusion 116p in a stacked direction.

Figure 2:
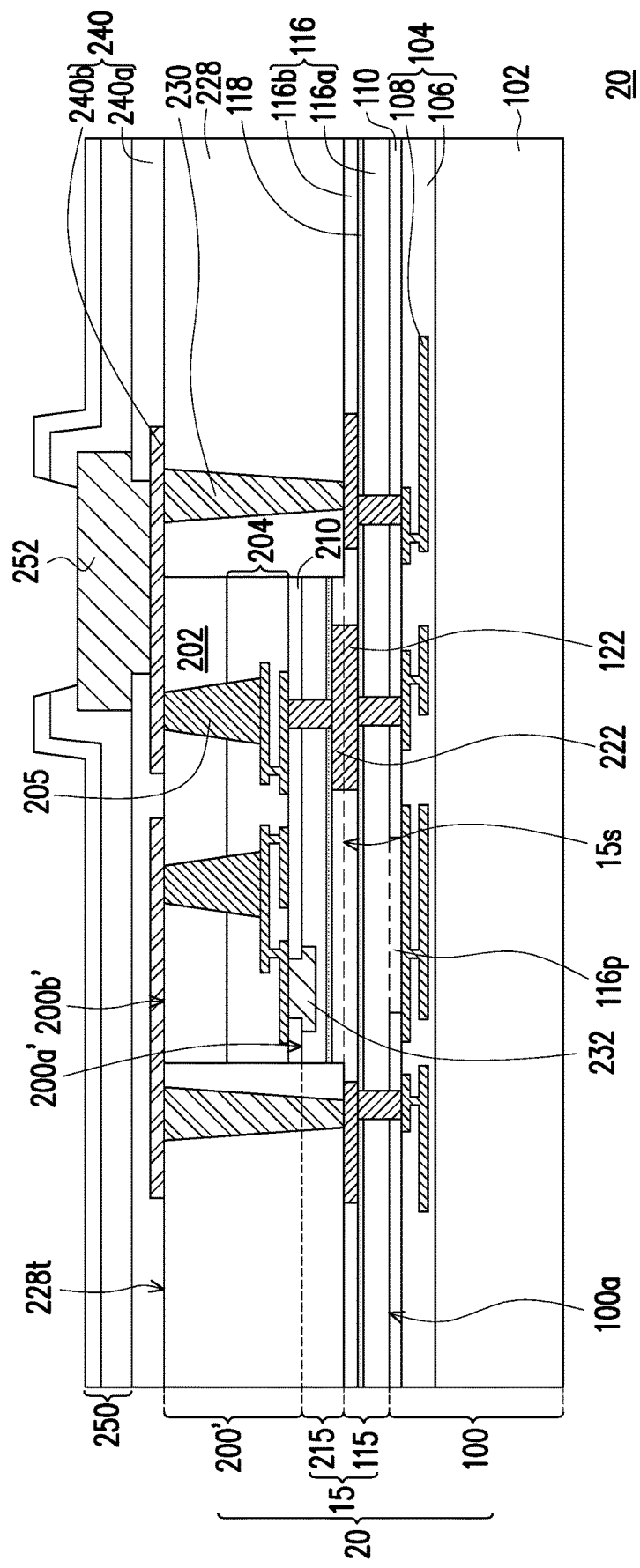
FIG. 2 is a cross-sectional view of a die stack structure in accordance with a second embodiment.

FIG. 2 is a cross-sectional view of a die stack structure in accordance with a second embodiment.

Referring to FIG. 2, a die stack structure 20 of the second embodiment is similar to the die stack structure 10 of the first embodiment. A difference therebetween lies in that a second test pad 232 for the CP test is formed over the front side 200a' of the second die 200'. Namely, the second test pad 232 is not removed after the CP test. As shown in FIG. 2, the second test pad 232 penetrates the second passivation layer 210 to contact with the second interconnect structure 204. Unlike the second test pad 212 illustrated in FIG. 1E, the second test pad 232 includes a metal material, such as aluminum, copper, nickel, gold, silver, tungsten, or a combination thereof. That is, the second test pad 232 is not a solder layer having Sn or Sn alloy. In some embodiments, the second test pad 232 may be formed by depositing a metal material layer through a suitable process such as electro-chemical plating process, CVD, atomic layer deposition (ALD), PVD or the like, and then patterning the metal material layer. Only the second test pad 232 is illustrated on the front side 200a' of the second die 200', however, the disclosure is not limited thereto. In some other embodiments, the test pad is able to formed on the front side 100a of the first die 100 and is not removed after the CP test.

FIG. 3A to FIG. 3F are cross-sectional views of a method of forming a die stack structure in accordance with a third embodiment.

Figure 3A:
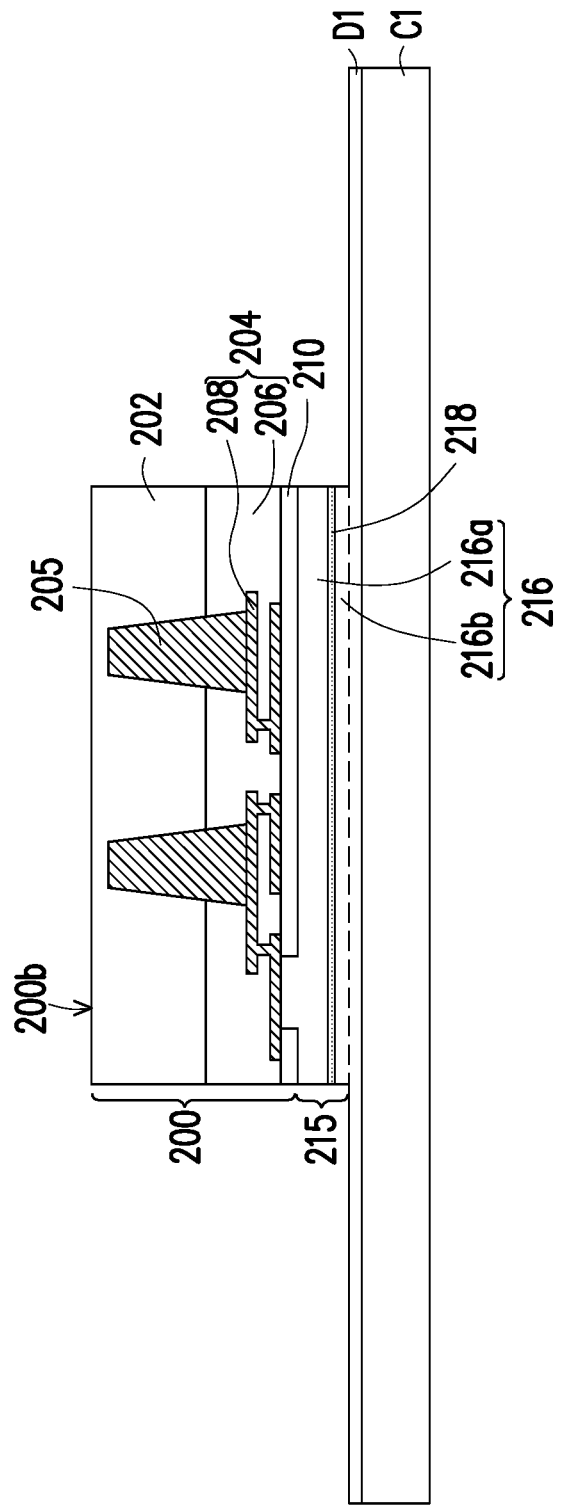
FIG. 3A to FIG. 3F are cross-sectional views of a method of forming a die stack structure in accordance with a third embodiment.

Referring to FIG. 3A, the second die 200 with the second bonding structure 215 illustrated in FIG. 1I is turned upside down and mounted onto a first dielectric layer D1 over a first carrier C1. In detail, the bonding dielectric material 216b of the second bonding structure 215 and the first dielectric layer D1 are bonded together by non-metal-to-non-metal bonding or fusion bonding, so that the second die 200 is disposed over the first carrier. In some embodiments, the first carrier C1 may be a glass carrier, a ceramic carrier, a semiconductor wafer carrier, or the like. In other embodiments, the first dielectric layer D1 includes an inorganic dielectric, such as SiO, SiN, SiON, or the like. The forming method of the first dielectric layer D1 may include CVD, ALD, or the like. In FIG. 3A, the TSVs 205 is embedded in the second semiconductor substrate 202 and covered by the backside 200b of the second die 200.

Figure 3B:
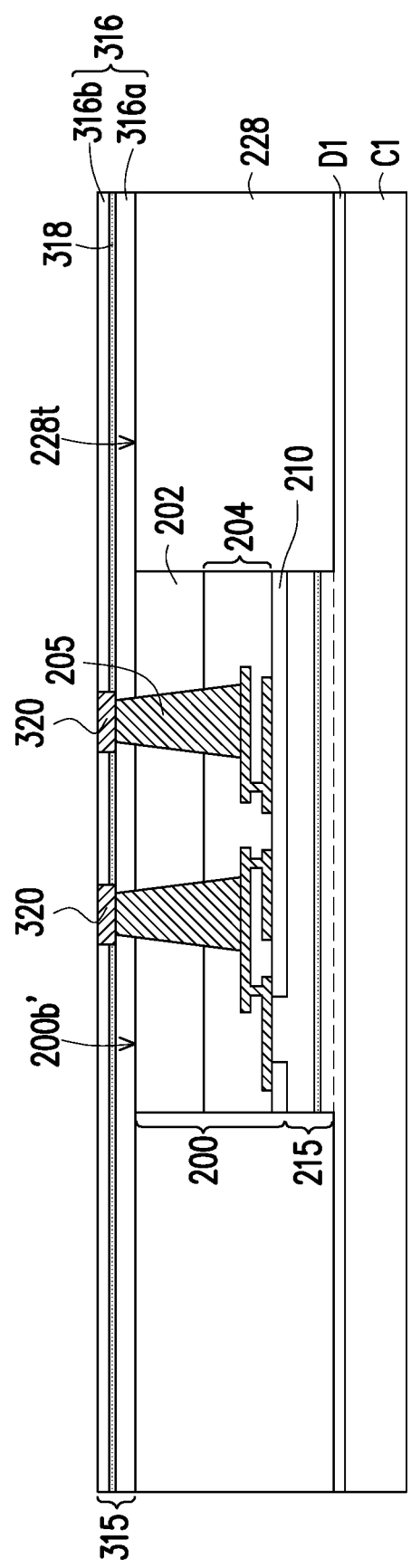

Referring to FIG. 3B, the gap-filling layer 228 is formed aside and laterally encapsulates the second die 200. More specifically, the gap-filling layer 228 is formed around the second die 200 and covers the first dielectric layer D1. The gap-filling layer 228 may be formed by firstly forming a gap-filling material (not shown) over and covering the backside 200b of the second die 200. Thereafter, the gap-filling material over the second die 200 is removed by a planarization process, such as a CMP process. In some embodiments, portions of the gap-filling material and the second semiconductor substrate 202 are removed, so that the backside 200b of the second die 200 (as shown in FIG. 3A) lowers until the TSVs 205 is exposed by the backside 200b' of the second die 200 (as shown in FIG. 3B). In the case, the backside 200b' of the second die 200 is substantially planar with the top surface 228t of the gap-filling layer 228.

In FIG. 3B, after the gap-filling layer 228 is formed, a third bonding structure 315 is formed over the backside 200b' of the second die 200 and the top surface 228t of the gap-filling layer 228. In detail, the third bonding structure 315 includes a third bonding dielectric layer 316, a third blocking layer 318, and a third bonding metal layer 320. The third bonding dielectric layer 316 includes bonding dielectric materials 316a and 316b. The third blocking layer 318 is disposed and sandwiched between the bonding dielectric materials 316a and 316b. In FIG. 3B, the third bonding metal layer 320 is referred to as a single damascene structure. That is, the third bonding metal layer 320 is embedded in the bonding dielectric material 316b and the third blocking layer 318 by the single damascene process and electrically connected to the TSVs 205 exposed by the backside 200b of the second die 200. The TSVs 205 illustrated in FIG. 3B protrude from the backside 200b of the second die 200, however, the disclosure is not limited thereto. In other embodiments, top surfaces of the TSVs 205 are coplanar with the backside 200b' of the second die 200. Moreover, the material and forming method of the third bonding structure 315 are similar to the material and forming method of the first bonding structure 115. Thus, details thereof are omitted here.

Figure 3C:
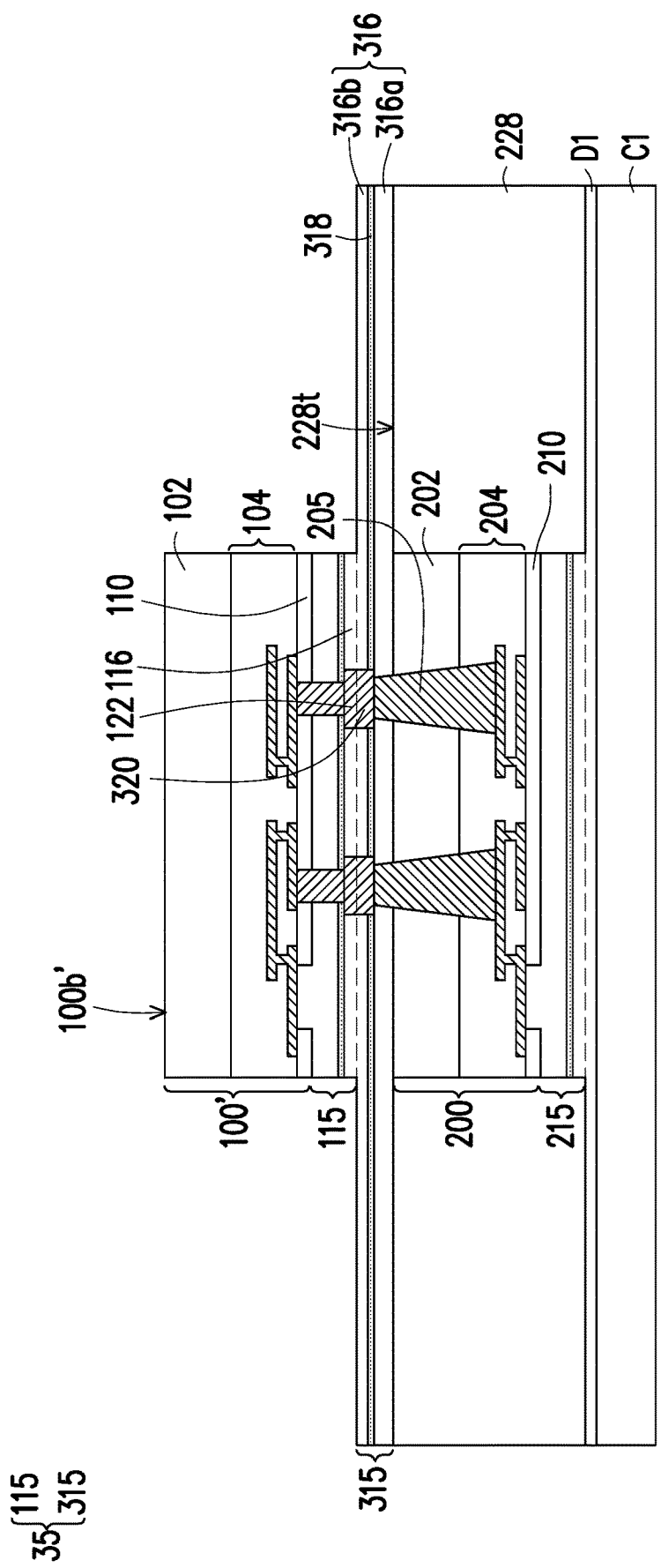

Referring to FIG. 3C, another first die 100' with the first bonding structure 115 is provided. In some embodiments, the first die 100' is formed by performing a singulation process on a wafer and is identified as a known good die (KGD). The first die 100' is turned upside down and mounted onto the third bonding structure 315.

In detail, the first die 100' and the second die 200 are face-to-back bonded together via the first bonding structure 115 and the third bonding structure 315. In some embodiments, before the first die 100' is bonded to the second die 200, the first bonding structure 115 and the third bonding structure 315 are aligned, such that the first bonding metal layer 122 may be bonded to the third bonding metal layer 320 and the first bonding dielectric layer 116 may be bonded to the third bonding dielectric layer 316. In some embodiments, the alignment of the first bonding structure 115 and the third bonding structure 315 may be achieved by using an optical sensing method. After the alignment is achieved, the first bonding structure 115 and the third bonding structure 315 are bonded together by a hybrid bonding to form a hybrid bonding structure 35.

The first bonding structure 115 and the third bonding structure 315 are hybrid bonded together by the application of pressure and heat. It is noted that the hybrid bonding involves at least two types of bonding, including metal-to-metal bonding and non-metal-to-non-metal bonding such as dielectric-to-dielectric bonding or fusion bonding. As shown in FIG. 3C, the hybrid bonding structure 35 includes the first bonding metal layer 122 and the third bonding metal layer 320 bonded by metal-to-metal bonding, and the first bonding dielectric layer 116 and the third bonding dielectric layer 316 bonded by non-metal-to-non-metal bonding.

Figure 3D:
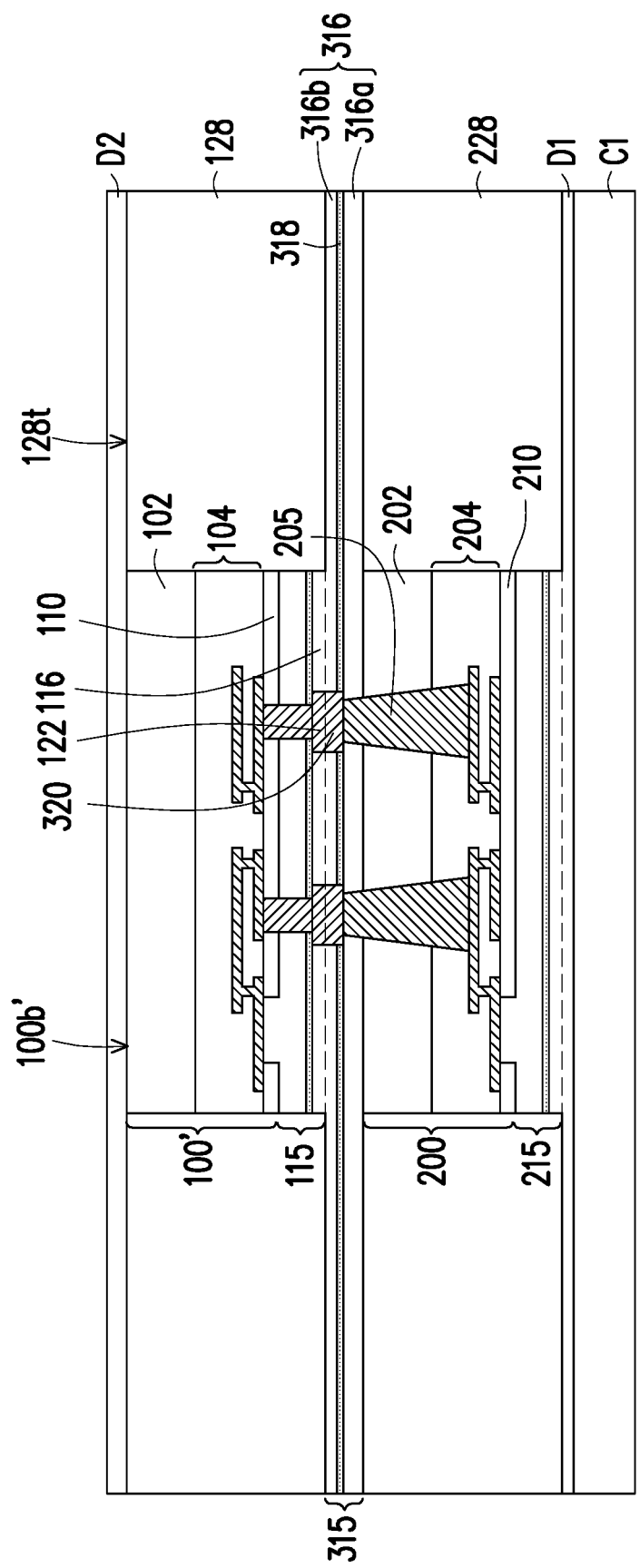

Referring to FIG. 3D, a gap-filling layer 128 is formed aside and laterally encapsulates the first die 100'. More specifically, the gap-filling layer 128 is formed around the first die 100' and covers third bonding structure 315. The gap-filling layer 128 may be formed by firstly forming a gap-filling material (not shown) over and covering the backside 100b' of the first die 100'. Thereafter, the gap-filling material over the first die 100' is removed by a planarization process, such as a CMP process. In some embodiments, a portion of the gap-filling material over the backside 100b' of the first die 100' is removed, so that the backside 100b' of the first die 100' is exposed. In the case, the backside 100b' of the first die 100' is substantially planar with a top surface 128t of the gap-filling layer 128. Moreover, the material and forming method of the gap-filling layer 128 are similar to the material and forming method of the gap-filling layer 228. Thus, details thereof are omitted here.

In FIG. 3D, after the gap-filling layer 128 is formed, a second dielectric layer D2 is formed over the backside 100b' of the first die 100' and the top surface 128t of the gap-filling layer 128. In an embodiment, the second dielectric layer D2 includes an inorganic dielectric, such as SiO, SiN, SiON, or the like. The forming method of the second dielectric layer D2 may include CVD, ALD, or the like. In some alternative embodiments, the first dielectric layer D1 and the second dielectric layer D2 have the same material or different materials.

Figure 3E:
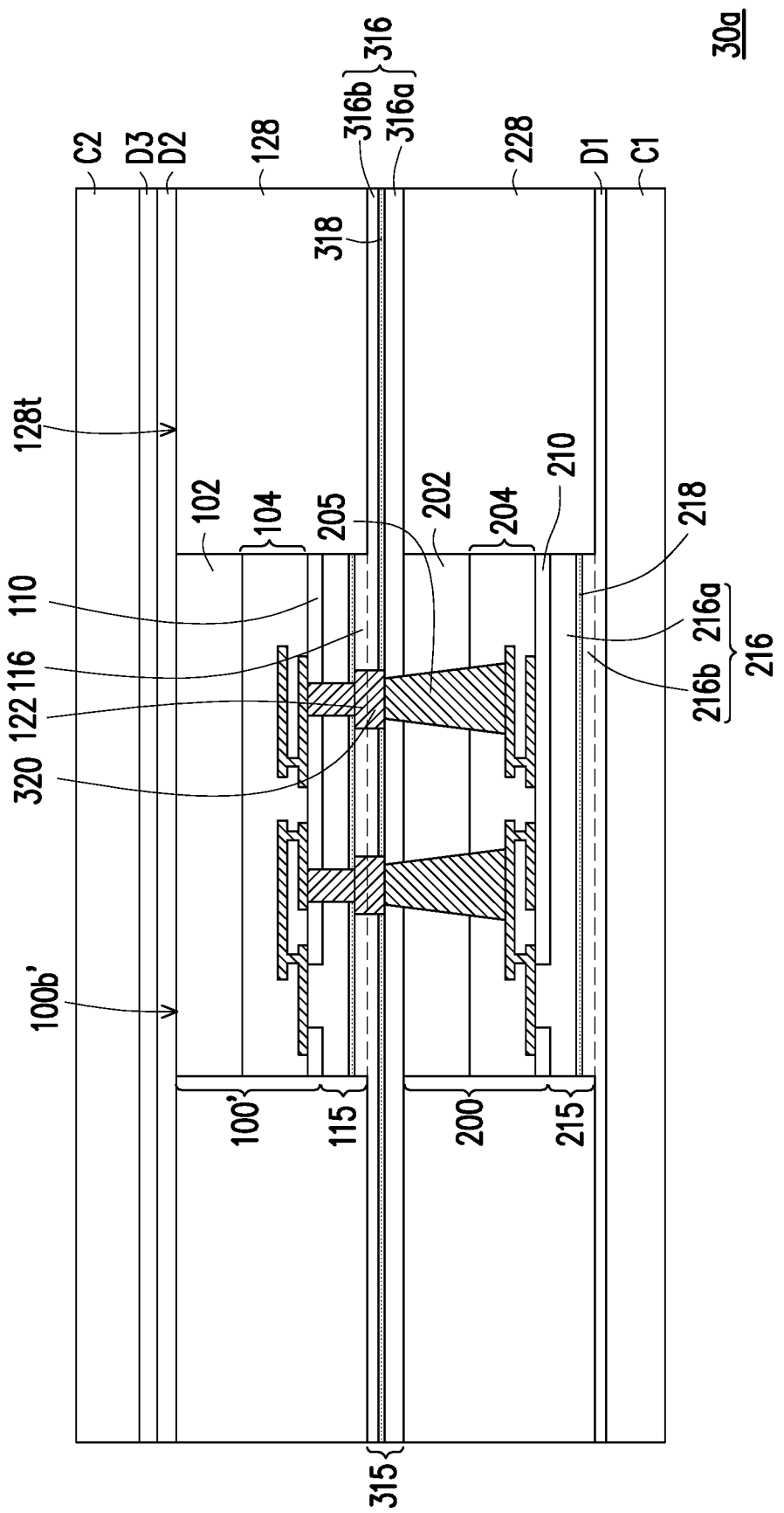

Referring to FIG. 3E, a second carrier C2 with a third dielectric layer D3 is mounted onto the second dielectric layer D2 to form a die stack structure 10a. In detail, the second dielectric layer D2 and the third dielectric layer D3 are bonded together by non-metal-to-non-metal bonding or fusion bonding. In some embodiments, the second carrier C2 may be a glass carrier, a ceramic carrier, a semiconductor wafer carrier, or the like. In an embodiment, the third dielectric layer D3 includes an inorganic dielectric, such as SiO, SiN, SiON, or the like. The forming method of the third dielectric layer D3 may include CVD, ALD, or the like. In some alternative embodiments, the third dielectric layer D3 and the second dielectric layer D2 have the same material or different materials.

Figure 3F:
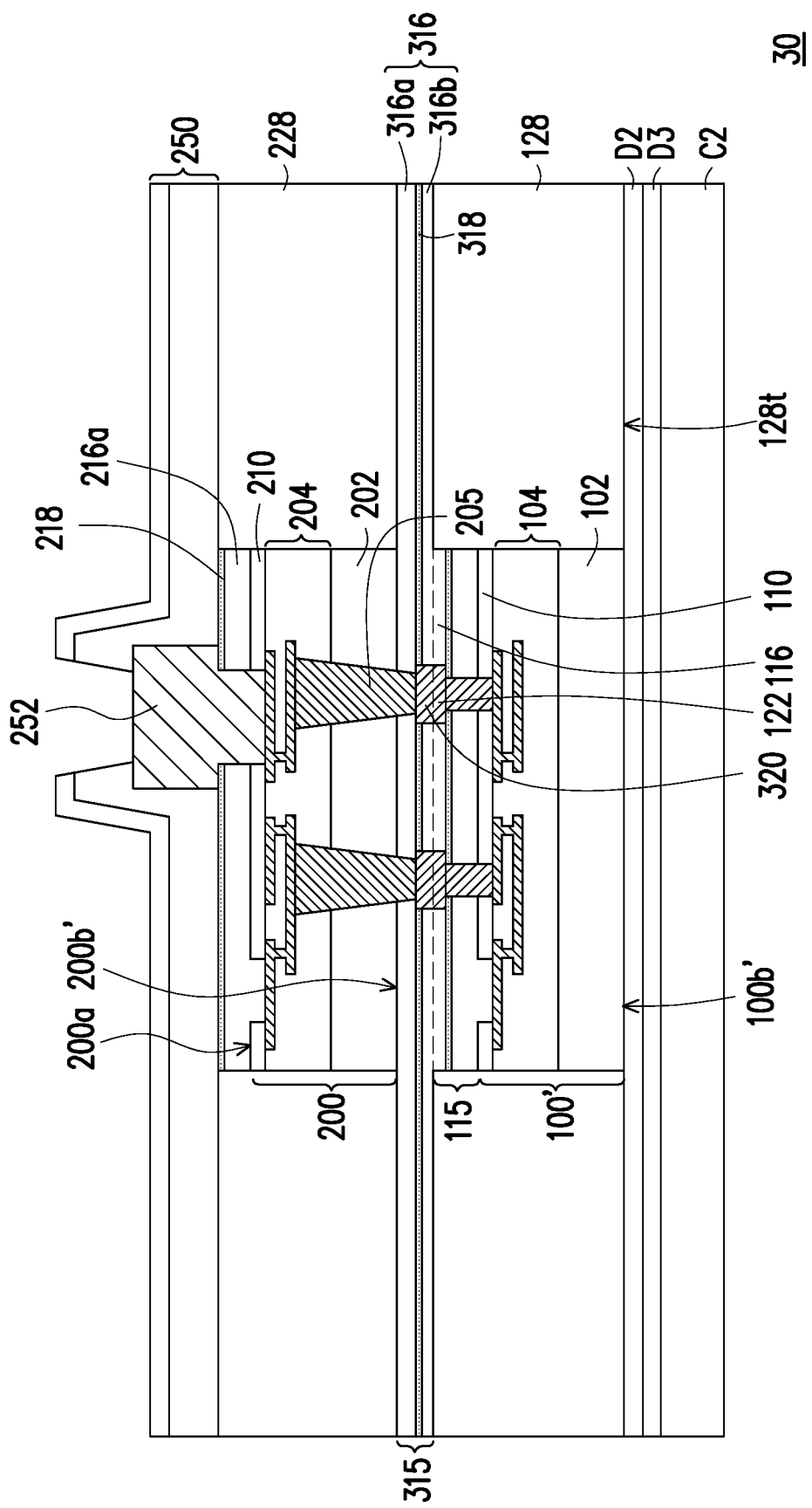

Referring to FIGS. 3E and 3F, the die stack structure 30a illustrated in FIG. 3E is turned upside down, so that the front side 200a of the second die 200 faces up. A grinding process is performed to remove the first carrier C1, the first dielectric layer DE and further remove the bonding dielectric material 216b and a portion of the gap-filling layer 228, until the second blocking layer 218 is exposed. In some embodiments, the grinding process includes a CMP process, a mechanical grinding process, or the like.

In FIG. 3F, at least one bonding pad 252 is formed to penetrate through the second blocking layer 218, the bonding dielectric material 216a, the second passivation layer 210 and electrically connect to the second interconnect structure 204 of the second die 200. The bonding pad 252 may be used for mounting conductive connectors (e.g., metal pillars, μ-bumps or a combination thereof) bumps, and/or for conducting a die backside performance test. The number of the bonding pad 252 is not limited in this disclosure. The material of the bonding pad 252 includes a metal, such as aluminum, copper, nickel, gold, silver, tungsten or alloys thereof.

In FIG. 3F, after a passivation layer 250 is formed over the front side 200a of the second die 200 and partially covers the bonding pad 252, a die stack structure 30 is accomplished. In some embodiments, the passivation layer 250 includes silicon oxide, silicon nitride, benzocyclobutene (BCB) polymer, polyimide (PI), polybenzoxazole (PBO) or a combination thereof and is formed by a suitable process such as spin coating, CVD or the like. In the case, as shown in FIG. 3F, the die stack structure 30 includes the first die 100' and the second die 200 bonded together in a face-to-back configuration. That is, the backside 200b' of the second die 200 faces toward the front side 100a' of the first die 100' and the first die 100' and the second die 200 are bonded together by the first bonding structure 115 and the third bonding structure 315.

Moreover, in FIG. 3F, both of the first die 100' and the second die 200 have bonding dielectric material 116a and 216a extend to contact with the interconnect structure 104 and 204, however, the disclosure is not limited thereto. In some other embodiments, one of the first die 100' or the second die 200 may have a test pad formed on the front side 100a' or 200a of the first die 100' or the second die 200 and is not removed after the CP test. In some alternative embodiments, the first die 100' and the second die 200 have the same function or different functions.

Figure 4:
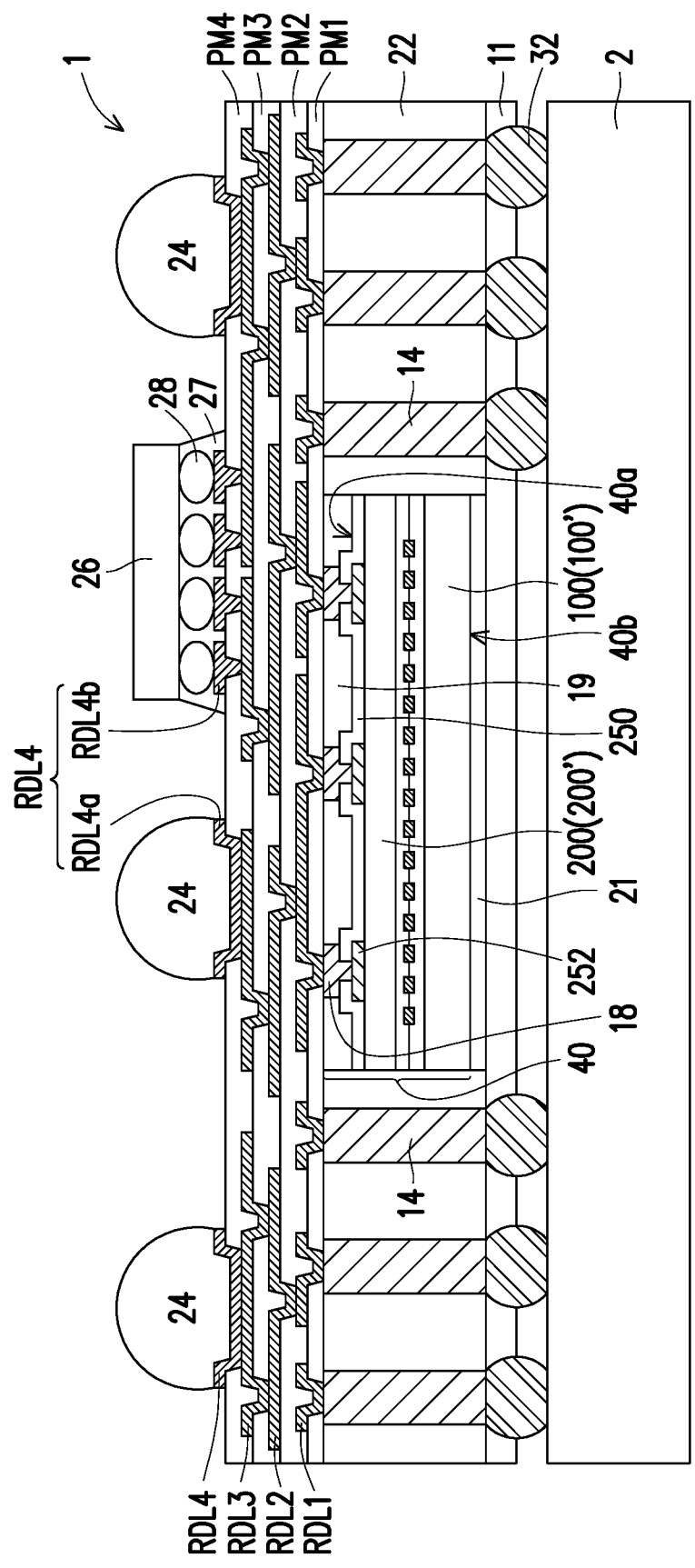
FIG. 4 is a cross-sectional view of a package in accordance with one embodiment.

FIG. 4 is a cross-sectional view of a package in accordance with one embodiment.

Referring to FIG. 4, a die stack structure 40 having a first surface 40a and a second surface 40b opposite to each other is mounted over a dielectric layer 11 by an adhesive layer 21. The first surface 40a of the die stack structure 40 is toward upward, while the second surface 40b of the die stack structure 40 is toward the dielectric layer 11. In some embodiments, the die stack structure 40 may be one of the die stack structure 10, 20, and 30. That is, the die stack structure 40 includes the first die 100 or 100' and the second die 200 which are face-to-face bonded together (as shown in FIG. 1K and/or FIG. 2) or face-to-back bonded together (as shown in FIG. 3F). In the embodiment, the die stack structure 40 further includes a plurality of connectors 18 and a passivation layer 19. The connectors 18 are formed over and electrically connected to the bonding pads 252 not covered by the passivation layer 250. The connector 18 includes solder bumps, gold bumps, copper bumps, copper posts, copper pillars, or the like. The passivation layer 19 is formed over the passivation layer 250 and aside the connectors 18 to cover the sidewalls of the connectors 18.

Referring to FIG. 4, an insulating encapsulation 22 is formed aside the die stack structure 40 to encapsulate the die stack structure 40. A plurality of conductive posts 14 are formed in the insulating encapsulation 22 and surround the die stack structure 40. A redistribution layer (RDL) structure 23 is formed over and electrically connected to the die stack structure 40 and the conductive posts 14. In some embodiments, the RDL structure 23 includes a plurality of polymer layers PM1, PM2, PM3 and PM4 and a plurality of redistribution layers RDL1, RDL2, RDL3 and RDL4 stacked alternately. The number of the polymer layers or the redistribution layers is not limited by the disclosure.

In other words, the redistribution layer RDL1 penetrates through the polymer layer PM1 and is electrically connected to the connectors 18 of the die stack structure 40 and the conductive posts 14. The redistribution layer RDL2 penetrates through the polymer layer PM2 and is electrically connected to the redistribution layer RDL1. The redistribution layer RDL3 penetrates through the polymer layer PM3 and is electrically connected to the redistribution layer RDL2. The redistribution layer RDL4 penetrates through the polymer layer PM4 and is electrically connected to the redistribution layer RDL3. In some embodiments, each of the polymer layers PM1, PM2, PM3 and PM4 includes a photo-sensitive material such as polybenzoxazole (PBO), polyimide (PI), benzocyclobutene (BCB), a combination thereof or the like. In some embodiments, each of the redistribution layers RDL1, RDL2, RDL3 and RDL4 includes conductive materials. The conductive materials include metal such as copper, nickel, titanium, a combination thereof or the like, and are formed by an electroplating process. In some embodiments, the redistribution layers RDL1, RDL2, RDL3 and RDL4 respectively includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may be copper or other suitable metals. In some embodiments, the redistribution layers RDL1, RDL1, RDL3 and RDL4 respectively includes a plurality of vias and a plurality of traces connected to each other. The vias respectively connects the traces, and the traces are respectively located on the polymer layers PM1, PM2, PM3 and PM 4, and are respectively extending on the top surface of the polymer layers PM1, PM2, PM3 and PM4.

In some embodiments, the topmost redistribution layer RDL4 includes RDL4a and RDL4b. The redistribution layer RDL4a is also referred to as under-ball metallurgy (UBM) layer for ball mounting. The redistribution layer RDL4b may be micro bump for connecting to an integrated passive device (IPD) 26 formed in the subsequent process.

Thereafter, a plurality of connectors 24 are formed over and electrically connected to the redistribution layer RDL4a of the redistribution layer structure 23. In some embodiments, the connectors 24 are made of a conductive material with low resistivity, such as Sn, Pb, Ag, Cu, Ni, Bi or an alloy thereof, and are formed by a suitable process such as evaporation, plating, ball drop, or screen printing. An IPD 26 is formed over and electrically connected to the redistribution layer RDL4b of the redistribution layer structure 23 through the solder bumps 28. The IPD 26 may be a capacitor, a resistor, an inductor or the like, or a combination thereof. The number of the IPD 26 is not limited to that is shown in FIG. 4, but may be adjusted according to the design of the product. An underfill layer 27 is formed between the IPD 26 and the polymer layer PM4, and surrounds and covers the exposed RDL4b, the solder bumps 28 and the bottom surface of the IPD 26.

As shown in FIG. 4, after the dielectric layer 11 is then patterned such that lower surfaces of the conductive posts 14 is exposed by the dielectric layer 11, an integrated fan-out package 1 having dual-side terminals is accomplished. Another package 2 is then provided to electrically connect to the integrated fan-out package 1 through a plurality of conductive terminals 32 such that a package-on-package (POP) structure P1 is fabricated. In some embodiments, the package 2 is, for example, a memory device.

According to some embodiments, a die stack structure includes a first die and a second die. The first die and the second die are bonded together through a hybrid bonding structure. A bonding insulating layer of the hybrid bonding structure extends to contact with one interconnect structure of the first die or the second die.

According to some embodiments, a method of manufacturing a die stack structure includes the following steps. A first die includes a first passivation layer having a first opening that exposes a first interconnect structure of the first die. A first test pad is formed in the first opening. A first circuit probing (CP) test is performed on the first test pad. The first test pad is removed. A first bonding structure is formed over a front side of the first die. A second bonding structure is formed over a front side of the second die. The first die and the second die are bonded together.

According to some embodiments, a package includes a die stack structure, an insulating encapsulation, and a redistribution layer (RDL) structure. The die stack structure includes a first die, a second die, and a hybrid bonding structure. The first die and the second die are bonded together through the bonding structure. A bonding insulating layer of the hybrid bonding structure extends to contact with one interconnect structure of the first die or the second die. The insulating encapsulation encapsulates the die stack structure. The RDL structure is disposed over the die stack structure and the insulating encapsulation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a die stack structure, comprising:
   providing a first die which comprises a first passivation layer having a first opening that exposes a first interconnect structure of the first die;
   forming a first test pad in the first opening;
   performing a first circuit probing (CP) test on the first test pad;
   removing the first test pad to expose the first opening;
   forming a first bonding structure over a front side of the first die, comprising:
      forming a first bonding dielectric material to fill in the first opening and contact with the first interconnect structure of the first die;
      forming a first blocking layer over the first bonding dielectric material;
      forming a second bonding dielectric material over the first blocking layer; and
      forming a first via plug in the first bonding dielectric material and the first blocking layer and forming a first conductive feature over the first via plug by a first damascene process;
   forming a second bonding structure over a front side of a second die; and
   bonding the first die and the second die.

2. The method of claim 1, wherein the bonding the first die and the second die comprises bonding the first die and the second die together by the first bonding structure and the second bonding structure.

3. The method of claim 1, wherein the forming the second bonding structure over the front side of the second die comprises:
   providing the second die which comprises a second passivation layer having a second opening that exposes a second interconnect structure of the second die;
   forming a second test pad in the second opening;
   performing a second circuit probing (CP) test on the second test pad;
   removing the second test pad;
   forming a third bonding dielectric material over the front side of the second die to fill in the second opening and contact with the second interconnect structure of the second die;
   forming a second blocking layer over the third bonding dielectric material;
   forming a fourth bonding dielectric material over the second blocking layer; and
   forming a second via plug in the third bonding dielectric material and the second blocking layer and forming a second conductive feature over the second via plug by a second damascene process.

4. The method of claim 3, wherein the first test pad or the second test pad comprises a solder layer having Sn or Sn alloy.

5. The method of claim 3, wherein the first conductive feature is in physical contact with the second conductive feature, and the second bonding dielectric material is in physical contact with the fourth bonding dielectric material.

6. The method of claim 3, wherein the second blocking layer has a dielectric material different from the third and fourth bonding dielectric materials.

7. The method of claim 1, further comprising:
   forming a gap-filling layer laterally encapsulating the second die; and
   forming a redistribution circuit structure over a backside of the second die and the gap-filling layer.

8. The method of claim 1, wherein the first blocking layer has a dielectric material different from the first and second bonding dielectric materials.

9. The method of claim 1, wherein a second test pad of the second die is not removed after performing a second circuit probing (CP) test, and the second test pad still exists in the second die after the bonding the first die and the second die.

10. A method of manufacturing a die stack structure, comprising:
    providing a first die which comprises a first passivation layer having a first opening that exposes a first interconnect structure of the first die;
    forming a first test pad in the first opening;
    performing a first circuit probing (CP) test on the first test pad;
    removing the first test pad to expose the first opening;
    forming a first bonding structure over a front side of the first die;
    forming a second bonding structure over a front side of a second die;
    bonding the first die and the second die;
    forming a gap-filling layer laterally encapsulating the second die; and
    forming a redistribution circuit structure over a backside of the second die and the gap-filling layer.

11. The method of claim 10, wherein the forming the first bonding structure over the front side of the first die comprises:
    forming a first bonding dielectric material over the front side of the first die to fill in the first opening and contact with the first interconnect structure of the first die;
    forming a first blocking layer over the first bonding dielectric material;
    forming a second bonding dielectric material over the first blocking layer; and
    forming a first via plug in the first bonding dielectric material and the first blocking layer and forming a first conductive feature over the first via plug by a first damascene process.

12. The method of claim 11, wherein the forming the second bonding structure over the front side of the second die comprises:
    providing the second die which comprises a second passivation layer having a second opening that exposes a second interconnect structure of the second die;
    forming a second test pad in the second opening;
    performing a second circuit probing (CP) test on the second test pad;
    removing the second test pad;
    forming a third bonding dielectric material over the front side of the second die to fill in the second opening and contact with the second interconnect structure of the second die;
    forming a second blocking layer over the third bonding dielectric material;
    forming a fourth bonding dielectric material over the second blocking layer; and
    forming a second via plug in the third bonding dielectric material and the second blocking layer and forming a second conductive feature over the second via plug by a second damascene process.

13. The method of claim 12, wherein the first test pad or the second test pad comprises a solder layer having Sn or Sn alloy.

14. The method of claim 10, further comprising:
forming a through dielectric via (TDV) in the gap-filling layer to electrically connect to the first interconnect structure and the redistribution circuit structure.

15. A method of manufacturing a die stack structure, comprising:
providing a first die which comprises a first passivation layer having a first opening that exposes a first interconnect structure of the first die;
forming a first test pad in the first opening;
performing a first circuit probing (CP) test on the first test pad;
removing the first test pad to expose the first opening;
forming a first bonding structure over the first die, comprising:
forming a first bonding dielectric material to fill in the first opening and contact with the first interconnect structure of the first die;
forming a first blocking layer over the first bonding dielectric material;
forming a second bonding dielectric material over the first blocking layer; and
forming a first via plug in the first bonding dielectric material and the first blocking layer and forming a first conductive feature over the first via plug by a first damascene process;
forming a second bonding structure over a second die; and
bonding the first die and the second die.

16. The method of claim 15, wherein the forming the second bonding structure over the second die comprises:
providing the second die which comprises a second passivation layer having a second opening that exposes a second interconnect structure of the second die;
forming a second test pad in the second opening;
performing a second circuit probing (CP) test on the second test pad;
removing the second test pad to expose the second opening;
forming a third bonding dielectric material to fill in the second opening and contact with the second interconnect structure of the second die;
forming a second blocking layer over the third bonding dielectric material;
forming a fourth bonding dielectric material over the second blocking layer; and
forming a second via plug in the third bonding dielectric material and the second blocking layer and forming a second conductive feature over the second via plug by a second damascene process.

17. The method of claim 16, wherein the first conductive feature is in physical contact with the second conductive feature, and the second bonding dielectric material is in physical contact with the fourth bonding dielectric material.

18. The method of claim 16, wherein the second blocking layer has a dielectric material different from the third and fourth bonding dielectric materials.

19. The method of claim 15, wherein the first blocking layer has a dielectric material different from the first and second bonding dielectric materials.

20. The method of claim 15, further comprising:
forming a first gap-filling layer laterally encapsulating the first die; and
forming a second gap-filling layer laterally encapsulating the second die, wherein the second bonding structure extends between the first gap-filling layer and the second gap-filling layer.

* * * * *